(12) United States Patent
Stoll (10) Patent No.: US 10,820,587 B2
(45) Date of Patent: Nov. 3, 2020

(54) METHOD AND DEVICE FOR PRODUCING ELECTROMAGNETIC FIELDS THAT INFLUENCE THE NERVOUS SYSTEM OF INSECTS

(71) Applicants: Rebecca Stoll, Bachenbülach (CH); Ruven Stoll, Glattbrugg (CH)

(72) Inventor: Kurt Stoll, Glattbrugg (CH)

(73) Assignees: Rebecca Stoll, Bachenbülach (CH); Ruven Stoll, Glattbrugg (CH)

( * ) Notice: Subject to any disclaimer, the term of this patent is extended or adjusted under 35 U.S.C. 154(b) by 574 days.

(21) Appl. No.: 15/566,144

(22) PCT Filed: Apr. 12, 2016

(86) PCT No.: PCT/CH2016/000065
§ 371 (c)(1),
(2) Date: Oct. 12, 2017

(87) PCT Pub. No.: WO2016/165035
PCT Pub. Date: Oct. 20, 2016

(65) Prior Publication Data
US 2018/0084774 A1    Mar. 29, 2018

(30) Foreign Application Priority Data

Apr. 13, 2015 (CH) ........................................ 504/15

(51) Int. Cl.
*A01M 29/28* (2011.01)
*H03K 5/01* (2006.01)
*H03K 19/20* (2006.01)

(52) U.S. Cl.
CPC .............. *A01M 29/28* (2013.01); *H03K 5/01* (2013.01); *H03K 19/20* (2013.01)

(58) Field of Classification Search
CPC .......... A01M 29/28; H03K 5/01; H03K 19/20
See application file for complete search history.

(56) References Cited

U.S. PATENT DOCUMENTS

2018/0084774 A1*  3/2018  Stoll ..................... A01M 29/28
2019/0313630 A1* 10/2019  Stoll ........................ H04B 1/04

FOREIGN PATENT DOCUMENTS

AU        3404699 A  * 11/1999  ............ A01M 29/28
BR        9911019 A  *  9/2001  ............ A01M 29/28
(Continued)

OTHER PUBLICATIONS

Schlichting, N., "International Search Report," prepared for PCT/CH2016/000065, dated Jul. 28, 2016, five pages.

*Primary Examiner* — Daniel Pihulic
(74) *Attorney, Agent, or Firm* — Shackelford, Bowen, McKinley & Norton, LLP (57) ABSTRACT

The invention relates to a method and to a device for repelling insects by means of a two-channel pulse pattern transmitter (1), which, by means of the integrated antennas (34a, 34b), emits two electromagnetic waves (35a, 36a) phase-shifted against each other by 180 degrees and modulated and pulsed with the pulse patterns (24, 23) and produces two electromagnetic fields (35b, 36b), which act on insects (45) located in the radiation range (76) in such a way that the neurons (50, 53) located in the supraesophageal and subesophageal ganglia (48, 51) and the sensory neurons (65), the motor neurons (66), and the interneurons that exist in the central and peripheral nervous system (63, 64) of bloodsucking insects (45) are influenced in such a way that the signals and reflexes produced by the neurons trigger abnormal behaviors that put the insects into an inactive state such that bloodsucking insects cannot penetrate the skin of humans and thus cannot suck blood.

9 Claims, 7 Drawing Sheets

(56) References Cited

FOREIGN PATENT DOCUMENTS

| | | | | | |
|---|---|---|---|---|---|
| CH | 710951 | A2 | * | 10/2016 | ............... H03K 5/01 |
| CH | 713205 | A2 | * | 6/2018 | ............ A01M 29/28 |
| CN | 1306392 | A | * | 8/2001 | ............ A01M 29/28 |
| CN | 201188833 | Y | | 2/2009 | |
| CN | 201294823 | Y | | 8/2009 | |
| CN | 107864612 | A | * | 3/2018 | ............... H03K 5/01 |
| CN | 110139559 | A | * | 8/2019 | ............ A01M 29/28 |
| CZ | 20004023 | A3 | * | 9/2001 | ............ A01M 29/28 |
| DK | 3282840 | T3 | * | 7/2019 | ............ A01M 29/28 |
| EP | 1075181 | A1 | * | 2/2001 | ............ A01M 29/28 |
| EP | 3282840 | B1 | * | 4/2019 | ............... H03K 5/01 |
| ES | 2733596 | T3 | * | 12/2019 | ............... H03K 5/01 |
| HU | 0101819 | A2 | * | 9/2001 | ............ A01M 29/28 |
| KR | 20190092475 | A | * | 8/2019 | ............ A01M 29/28 |
| MX | PA00010657 | A | * | 2/2005 | ............ A01M 29/28 |
| WO | WO-9955151 | A1 | * | 11/1999 | ............ A01M 29/28 |
| WO | WO-99055151 | A1 | | 11/1999 | |
| WO | WO-2012094768 | A1 | * | 7/2012 | ............ A01M 29/18 |
| WO | WO-2016165035 | A1 | * | 10/2016 | ............... H03K 5/01 |
| WO | WO-2018104135 | A1 | * | 6/2018 | ............... H04B 1/04 |

* cited by examiner

METHOD AND DEVICE FOR PRODUCING ELECTROMAGNETIC FIELDS THAT INFLUENCE THE NERVOUS SYSTEM OF INSECTS

PRIOR ART

Malaria, yellow fever and dengue fever remain the most common infectious diseases in humans which are transferred by bloodsucking arthropods (vectors) and claim several million victims—above all children—each year. Despite all counteractive measures, malaria, among other diseases, is today constantly becoming more widespread as a result of wars and the related flow of refugees, mass tourism, as well as climate and environmental changes. The plasmodiidae, the agents of malaria, are resistant to most chemotherapeutics, and the carrier mosquitoes (Anopheles mosquitoes) have also developed a resistance to insecticides. Great efforts are being made to develop a vaccine against malaria. However, it is likely that it will take years for such vaccines to be available on the market. Whether this vaccine will then be affordable in developing countries remains questionable. It must also be assumed that the plasmodiidae will develop a resistance to future vaccines. Apart from chemically treated mosquito nets, which still offer humans only very limited protection against mosquitoes, to date, no methods or strategies have been able to protect humans against diseases spread by vectors (e.g. malaria, yellow fever, dengue fever).

DESCRIPTION

The invention relates to a method and device for repelling bloodsucking insects by means of a two-channel pulse pattern transmitter 1 which generates positive and negative pulse patterns, that are phase-shifted relative to each other by 180 degrees 15, 14, and which generates the switching frequency 4 which the carriers of the integrated transmitters 28, 29 modulate and control such that, via the integrated two-part antennas 34a, 34b, this emits two modulated electromagnetic waves 35a and 36a, which are phase-shifted against each other by 180 degrees and pulsed with the pulse patterns 15, 14, and generates two electromagnetic fields 35b, 36b which influence the nerve cells 50, 53 located in the nervous systems 48,53,63,64 of bloodsucking insects, such that the signals and reflexes generated by the neurons trigger malfunctions which put the insects into an inactive state so that they cannot penetrate the human skin and thus do not suck the blood.

For this purpose, the invention is defined by the features listed in claim 1.

The method according to the invention and the device according to the invention consist of an autonomous two-channel pulse pattern transmitter 1 (FIG. 1), in which complex components are integrated, in order to generate positive, negative and phase-shifted pulse patterns which modulate two carrier signals in two transmitters and emit these via an antenna to the external environment as electromagnetic waves and fields which act on the nervous system of insects, in particular on the nerve cells located in the supraesophageal ganglion and suboesophageal ganglion and the docked axon terminals which establish signal transfers among the nerve cells, such that said insects do not bite.

Figure 1:
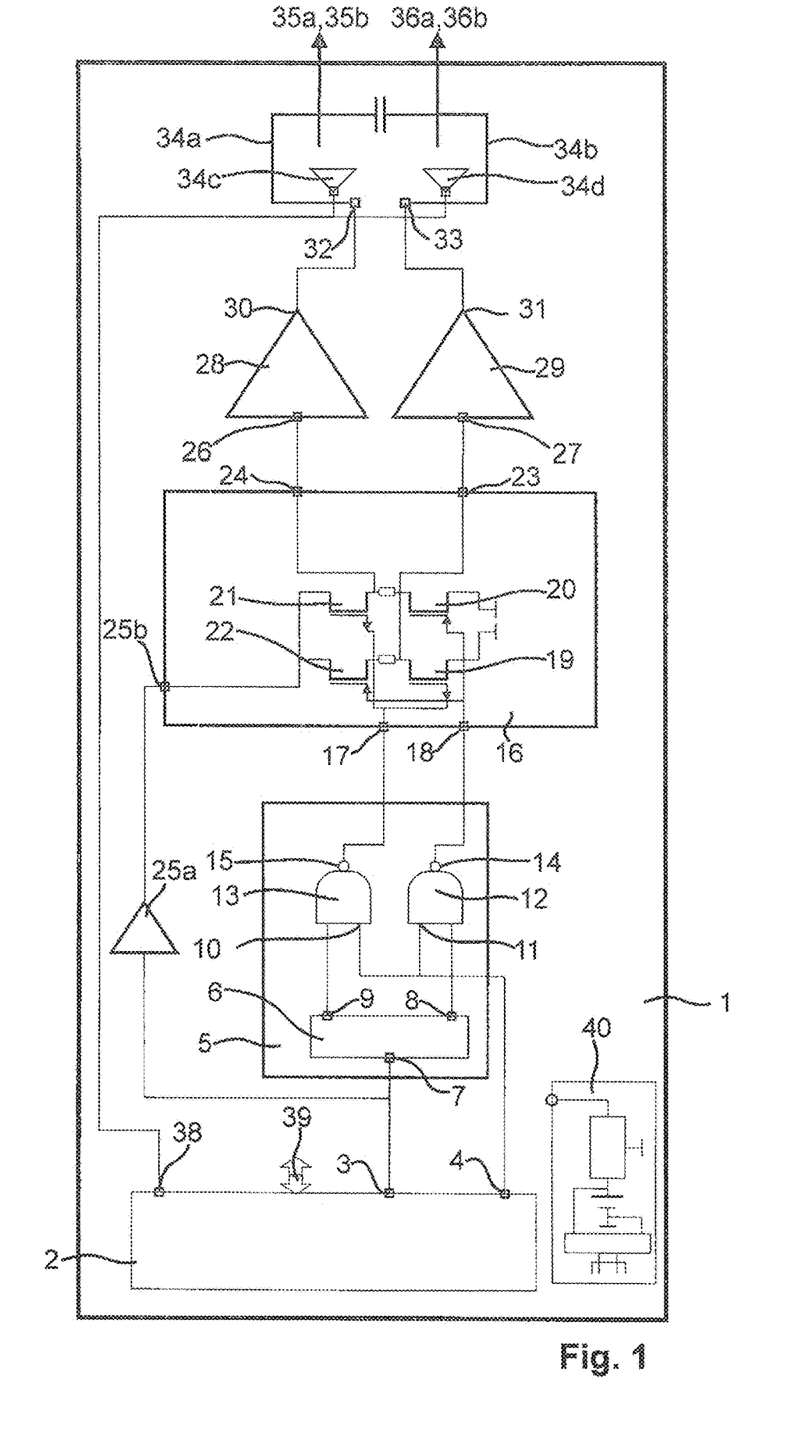
FIG. 1 shows an autonomous two-channel pulse pattern transmitter according to the invention with the integrated components microprocessor, modulator, phase converter, transmitters, antennas, detectors and power supply with integrated battery.

The microprocessor 2, modulator 5, phase converter 17, transmitters 28, 29 and antennas 34a and 34b with detectors 34c and 34d, and a power supply 40 with integrated battery which can be charged via a charge control, are integrated substantially as components in the two-channel pulse pattern transmitter 1. Furthermore, the two-channel pulse pattern transmitter 1 has two antenna detectors 34c, 34d which transfer information via transmission power and the emitted electromagnetic waves 35a, 36a and fields 35b, 36b to the input 38 of the microprocessor 2, such that this information can be read out via the interface 39 (FIG. 1).

Figure 2:
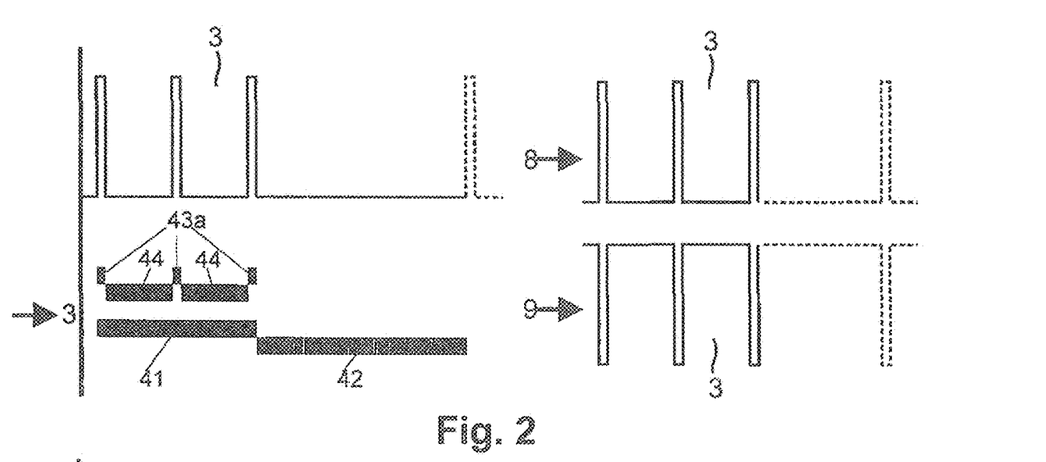
FIG. 2 through FIG. 6 show the pulse patterns generated by the microprocessor of FIG. 1.
Figure 3:
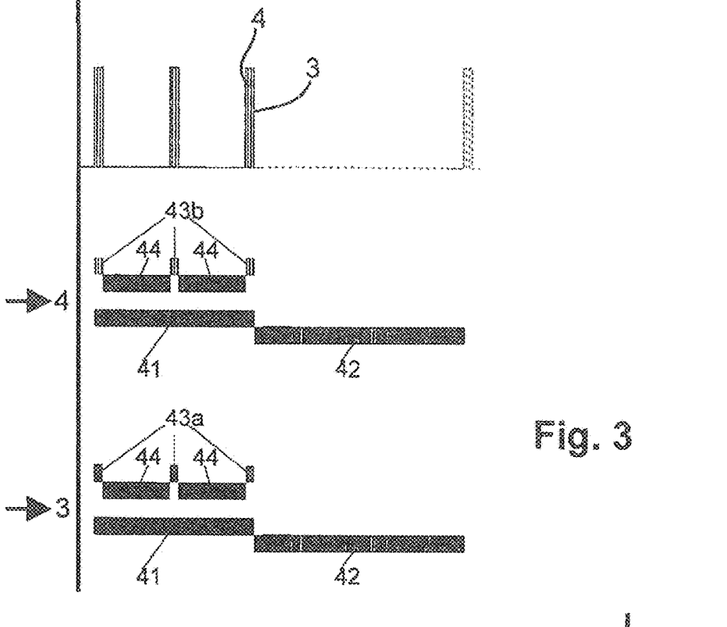

The microprocessor 2 generates a pulse pattern 3 consisting of a pulse 41 with a pulse width of 204 ms and a pulse pause 42 of 5000 ms. A second pulse source is established within the pulse 41, consisting of three pulses 43a with a pulse width of 12 ms and two pulse pauses of 84 ms 44 (FIG. 2). The modulation signal at the output 4 of the microprocessor 2 is generated in that the pulse pattern 3 is overlaid with the pulse frequency of 284 Hz 43b (FIG. 3).

However, the invention is not limited only to the modulation frequency of 284 Hz (pulse frequency) 4, in particular the frequency can be adapted to the different bloodsucking arthropods and defined.

Figure 4:
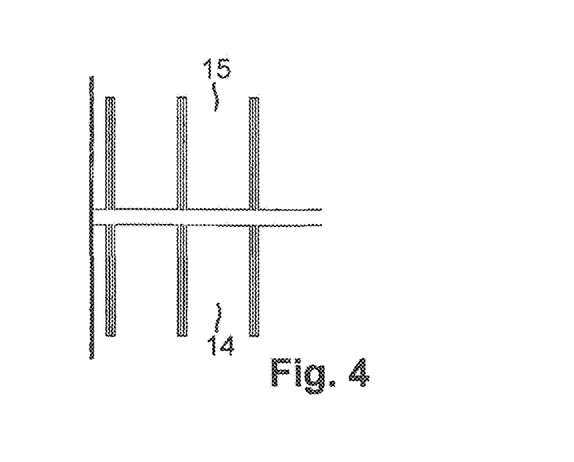

In order to receive positive and negative modulated pulse patterns, the pulse pattern 3 (FIG. 2) generated by the microprocessor 2 is directed to the downstream modulator 5 and the input 7 of the flip-flop 6, which generates a positive pulse pattern 3 at the output 8 (FIG. 2) which is directed to the input 10b of the downstream NAND gate 13. At the same time, a negative pulse pattern 3 is generated (FIG. 2) at the output 9 (of the flip-flop 6) which is directed to the input 11b of the downstream NAND gate 12. The modulation signal 4 (FIG. 3) generated by the microprocessor 2 is directed to the input 10a of the downstream NAND gate 13 and to the input 11a of the downstream NAND gate 12. The positive modulated pulse pattern is thus applied to the output 15 of the NAND gate 13 and the negative modulated pulse pattern is applied to the output 14 of the NAND gate 12 (FIG. 4).

Figure 5:
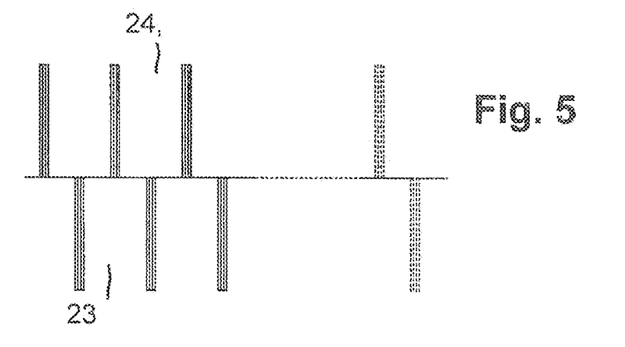

The pulse pattern converter 16 consists of four FETs which are connected to each other in order to receive two modulated pulse patterns 3 which are phase-shifted against each other by 180 degrees. In order to meet these requirements, the pulse pattern 3 is guided to the two drains of the FET 21 and FET 22 via the driver 25a and the input 25b. At the same time, the modulated positive pulse pattern 15 is directed to the gates of the FETs 19 and 21 via the input 17 and the modulated negative pulse pattern 14 is directed to the gates of the FETs 20 and 22 via the input 18. From this action, the direction of the signal flow of the positive pulse pattern 24, which is applied to the source of the FET 21, is established by a pulse sequence via FET 20 to ground, and the direction of the signal flow of the negative pulse pattern 23, which is applied to the drain of the FET 19 is established by a pulse sequence via FET 22 to the pulse pattern 3 which is applied to the input 25b, such that two pulse patterns 24, 23, which are phase-shifted against each other by 180° are generated (FIG. 5).

Figure 6:
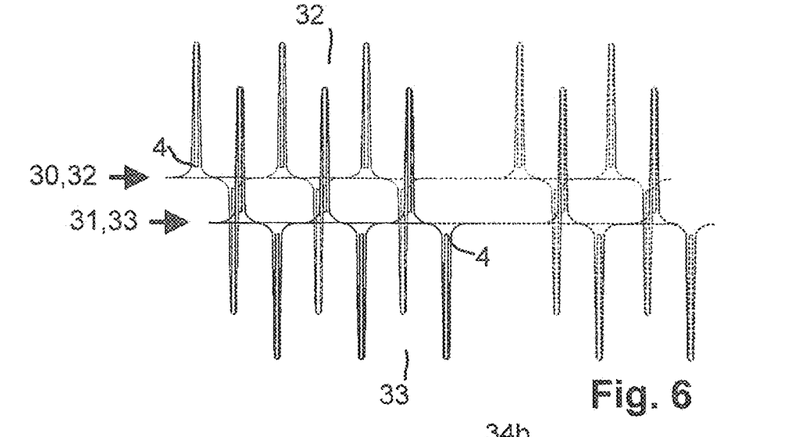
Figure 7:
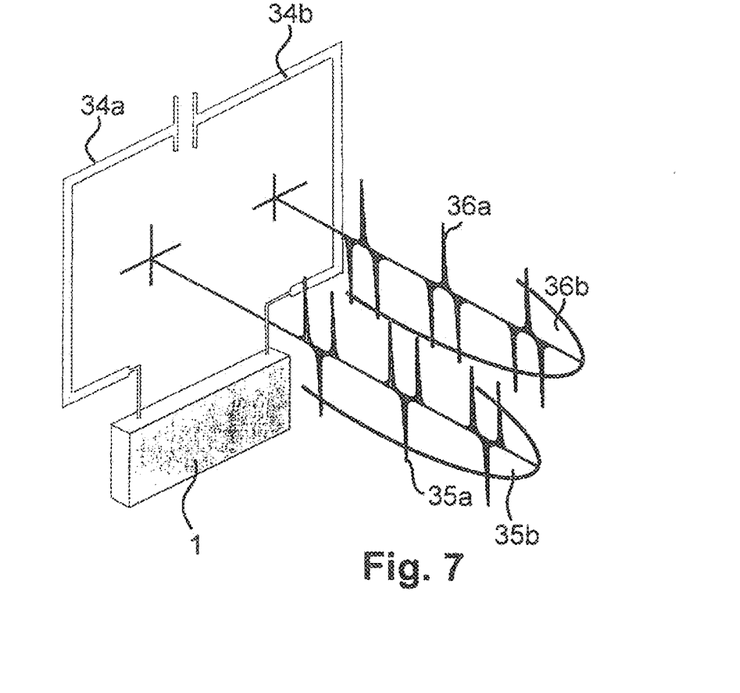
FIG. 7 shows the autonomous two-channel pulse pattern transmitter according to the invention and the integrated two-part magnetic emitting the modulated electromagnetic waves.
Figure 12:
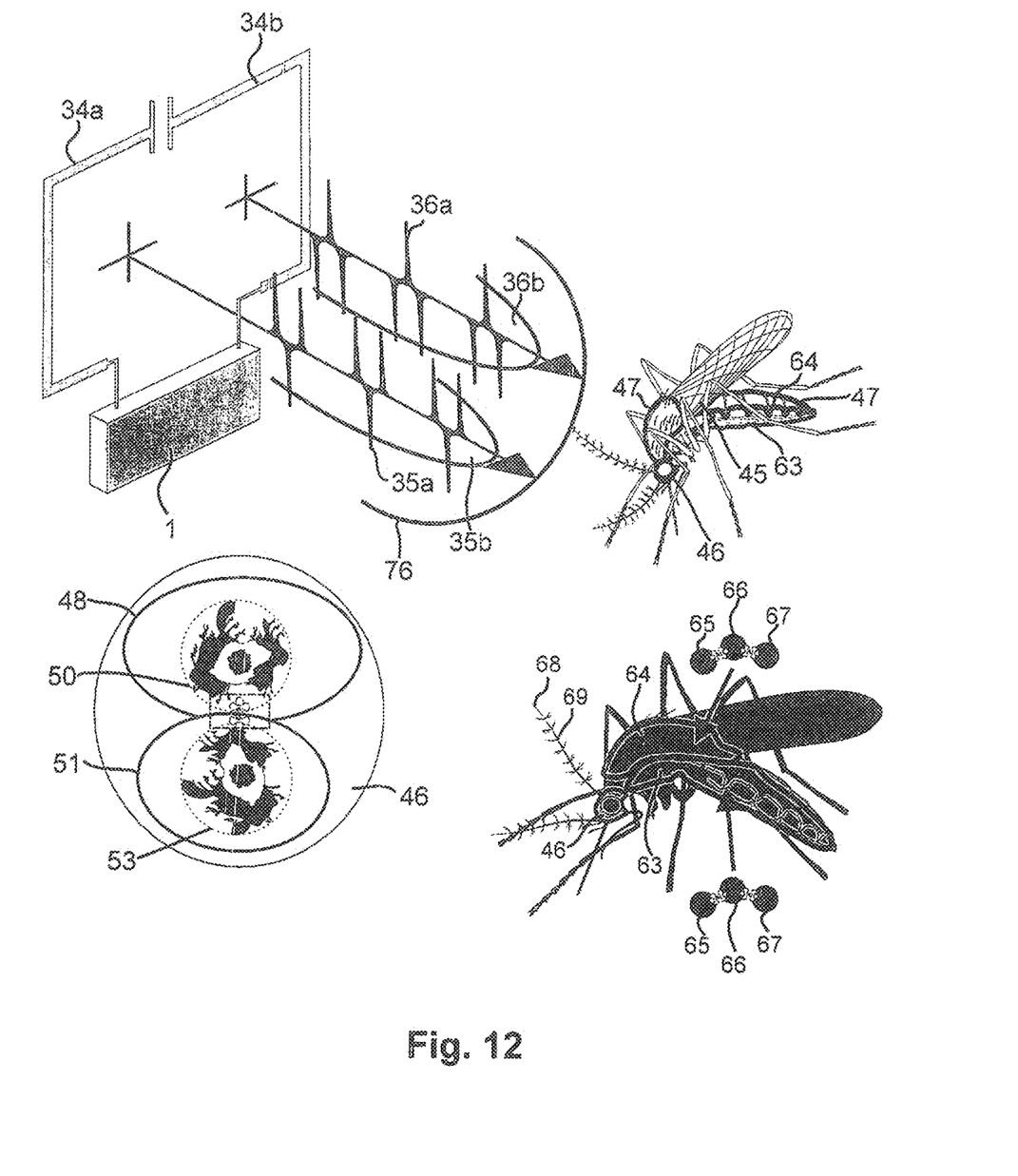
FIG. 12 and 13 show schematic representation of the autonomous two-channel pulse pattern transmitter of FIG. 7 influencing the nervous system of insects.

From this action, the modulated pulse pattern 24 (which is phase-shifted by 180 degrees relative to the pulse pattern 23) is directed to the input 26 of the transmitter 28 in order to modulate and control the oscillator thereof, which generates the carrier frequency of 160 kHz. At the same time, the modulated pulse pattern 23 (which is phase-shifted by 180 degrees relative to the pulse pattern 24) is directed to the input 27 of the transmitter 29 in order to modulate and control the oscillator thereof, which generates the carrier frequency of 160 kHz. Through these actions, two carriers arise which are pulsed and modulated with the pulse patterns 24 and 23 (FIG. 5), and which have a carrier frequency of 160 kHz 30, 31 and which are phase-shifted relative to each other by 180 degrees (FIG. 6). The two carriers are directed via the respective transmitter outputs 30 and 31, which each have a transmission power of 2 MW, to the terminals 32 and 33 of the integrated two-part magnetic antenna 34a and 34b (magnetic loops), which emits two modulated electromagnetic waves 35a and 36a which are phase-shifted relative to each other by 180 degrees and are pulsed with the pulse patterns 24, 23, and generates two electromagnetic fields 35b, 36b (FIG. 7). In the radiation range 76 (FIGS. 12, 13) (propagation of the electromagnetic waves and fields in the space) of approximately 30 metres relative to the integrated, two-part magnetic antenna 34a and 34b, there is a power density (supplied power of 2 MW in the antenna) which is sufficient for the emitted electromagnetic waves 35a, 36a and the generated electromagnetic fields 35b, 36b to act on a bloodsucking insect such that they can influence and disrupt the nervous system. (In the images in FIGS. 7, 12, 13, the propagation directions of the electromagnetic waves 35a, 36a and electromagnetic fields 35b, 36b are only illustrated in one direction and one plane.)

However, the invention is not limited only to the specified parameters of the power density, emitted energy, and modulation frequency (switching frequency), carrier frequency and transmission power, in particular the specified pulse patterns and carrier and modulation frequency values can be adapted to the different species of insects and defined. Laboratory tests with flight cages and field tests with aedes aegypti, the yellow fever transmitter, and with anopheles stephensi, which transmits malaria, have shown that different carrier frequencies (for example 433 MHz, 910 MHz, 1800 MHz, 2.44 GHz, 10 GHz, 24.4 GHz) and switching frequencies (for example 43 Hz, 470 Hz, 1800 Hz, 2457 Hz, 22 kHz, 56 kHz) have yielded good results in order to influence the central nervous system 63 and the peripheral nervous system 64 (FIG. 12) of the insects, in particular the neurons 50, 53 located in the supraesophageal ganglion 48 and suboesophageal ganglion 53 and their axon terminals 62 (which are located in the biological interfaces 72, 73, 74 and 75) such that said insects do not bite (FIGS. 8, 9, 12, 13).

Figure 8:
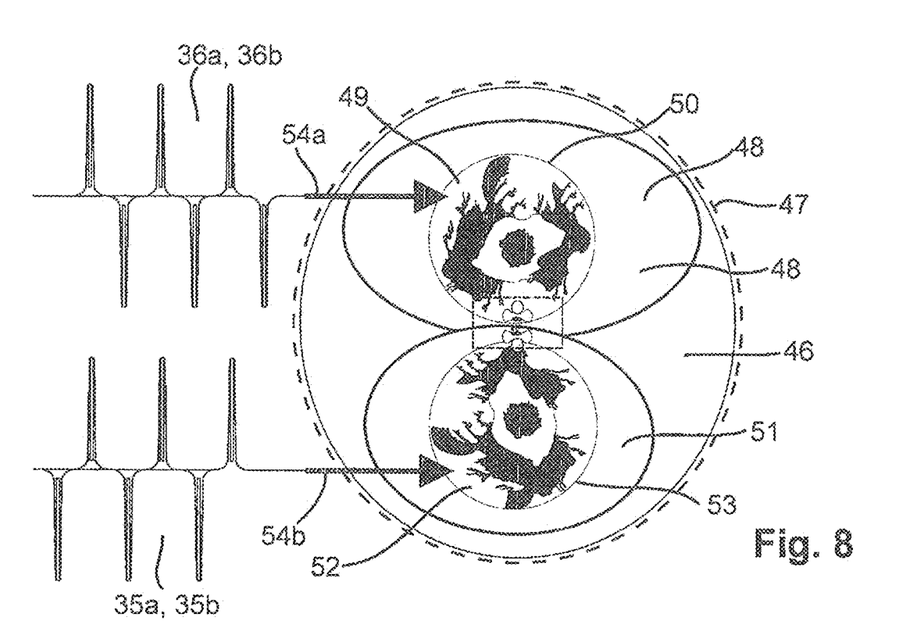
FIG. 8 shows a schematic representation of the further processes of an embodiment of the method according to the invention influencing the nervous system of insects.

According to an embodiment of the method according to the invention, the further processes are defined in greater detail in FIG. 8.

If bloodsucking insects 45 find themselves in the radiation range 76 (FIGS. 12, 13) (propagation of the electromagnetic waves and fields in the space) of approximately 30 metres relative to the integrated, two-part magnetic antenna 34a and 34b, they become radiation receivers in that the irradiation of the insect is performed by means of the effect of the electromagnetic waves 35a and 36a and the electromagnetic fields 35b, 36b (which are emitted in the two-channel pulse pattern transmitter 1 by the integrated antenna 34a and 34b), such that the chitin/exoskeleton 47 assumes the function of a demodulator in that the chitin fibres form an oscillating circuit which is set in a natural resonance such that only the low-frequency modulation frequency 4 and the electromagnetic pulse patterns 37a and 37b which are phase-shifted against each other by 180 degrees still reach the supraesophageal ganglion 48 and suboesophageal ganglion 51, which are located in the insect's head 46. An irradiation, by the low-frequency electromagnetic waves 35a and 36a and electromagnetic fields 35b, 36b, of the sensory neurons 50 (located in the supraesophageal ganglion 48) and of the motor neurons 53 (located in the suboesophageal ganglion 51) thus takes place, such that the biological processes (excitation transfer, electrical signal and reflex generation) are significantly disrupted.

Figure 9:
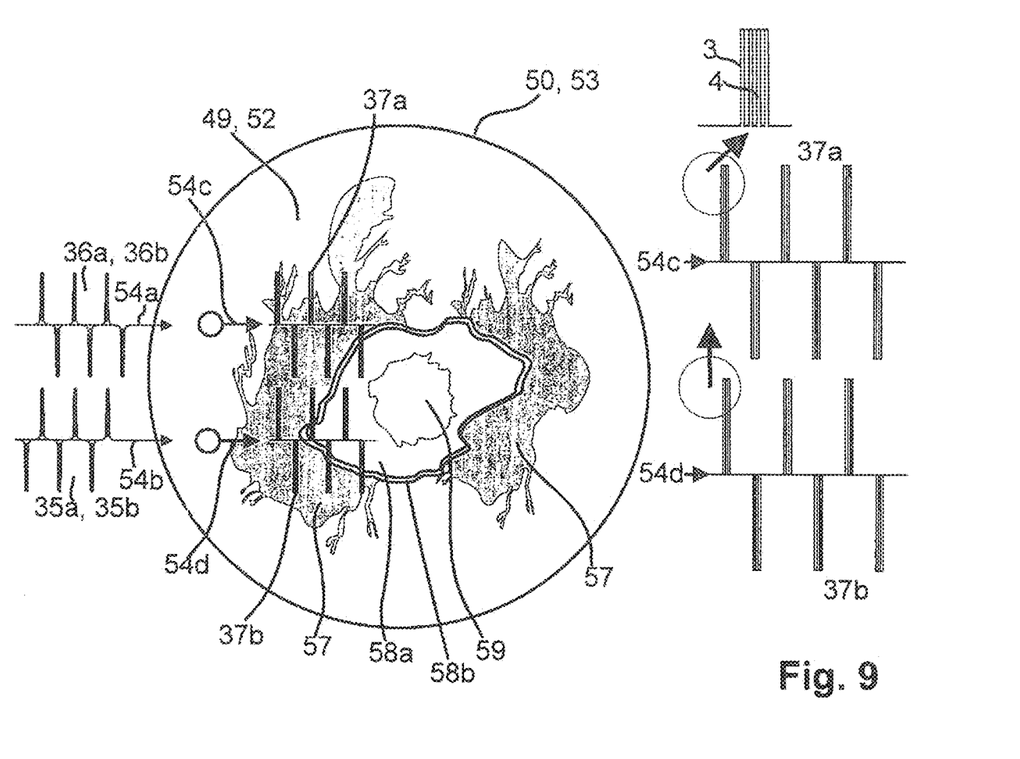
FIG. 9 shows a schematic representation of the further processes of a further embodiment of the method according to the invention influencing the nervous system of insects.
Figure 11:
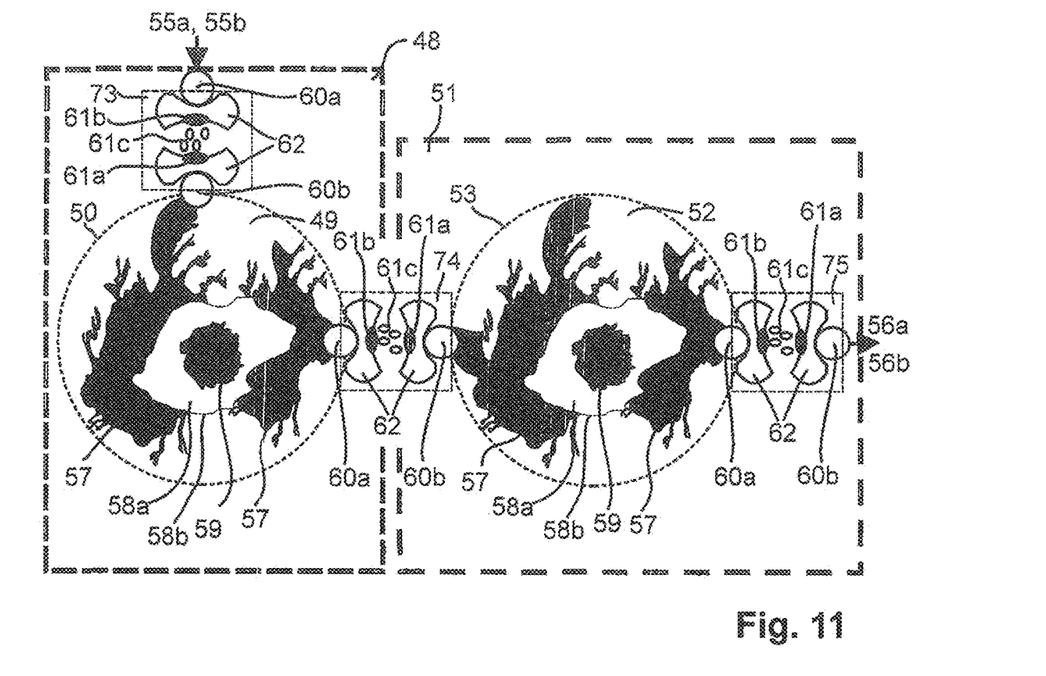
FIG. 11 shows a schematic representation of the further processes of a further embodiment of the method according to the invention influencing the nervous system of insects.

According to a further embodiment of the method according to the invention, the further processes are described and defined in greater detail in FIG. 9, FIG. 11. The radiating of the modulation frequency 4 and pulse patterns 37a and 37b into the sensory neuron 50 (which is located in the supraesophageal ganglion 48) influences the structure (signal structure SS) of the electrical potentials (electrical signals) on the cell membranes 49 which derive from the electrical depolarisation from the negative to the positive (or less negative value) state of charge on the inside of the cell membrane 49, such that, through the pulse patterns 37a and 37b which are phase-shifted by 180 degrees, through the change from the positive to negative phase, and the modulation frequency 4 which restores the cell membrane 49 to the state of its natural oscillation, it is significantly disrupted. The repolarisation (restoration of the resting membrane potential after previous depolarisation) is influenced such that it still becomes active during the depolarisation, or partially fails. The defective information (electrical signals) reach the dendrite 57 which transfers the decimated signals from the interface 74 to the dendrite 57 of the motor neuron 53 (which is located in the suboesophageal ganglion 51) via the docked axons 60a, 60b. The radiation of the pulse patterns 37a and 37b into the motor neuron 53 influence the structure of the reflexes on the cell membranes 52 in the same manner as biological procedures described in the signal structure SS, which have the same biological processes as those in the sensory neuron 49, except that instead of electrical signals, reflexes and reflex information are established on the surface of the cell membrane 52.

Via the axon 60b of the biological interface 75, the reflex signal transfer takes place over the motor nerve cord 56 to the central nervous system 63. Via associated biological interfaces, the defective reflexes are directed to the motor neurons, which control the muscles, glands and organ movements such that insects which find themselves in the radiation range 76 of the electromagnetic waves 35a and 36a and the electromagnetic fields 37a, 37b show inactive behaviour which partly leads to sleep states, such that bloodsucking insects do not bite.

Figure 10:
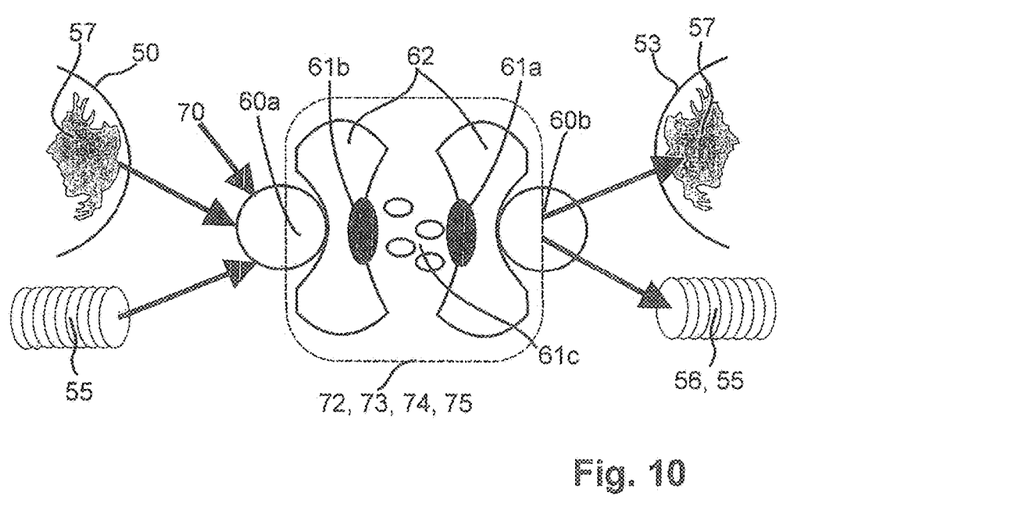
FIG. 10 shows a schematic representation of the further processes of a further embodiment of the method according to the invention influencing the nervous system of insects.

According to a further embodiment of the method according to the invention, the further processes are defined in greater detail in FIG. 10. The biological process of the signal or of the reflex transfer within the biological interfaces 72, 73, 74 and 75 takes place in that the incoming signals, which derive from the associated dendrites 57 in the sensory neuron 50 or from the sensory nerve 55, are directed onto the docked axon 60a of the axon terminal 62, which activate the neurotransmitter 61b such that there takes place an electrochemical pulse transfer 61c (synapse) to the neuroreceptor 61a, which forwards the received information to the axon 60b such that it reaches the associated dendrites 57 in the motor neuron 53 or the motor nerve cord 56. When the electrochemical pulse transfer 61c (synapse) between the neurotransmitter 61b and the neuroreceptor 61a takes place, the ion transfer and molecule transfer is influenced by the inward radiating of the modulation frequency 4 and the pulse patterns 37a and 37b such that the membrane potential at the neuroreceptor 61a is degraded too strongly, which leads to malfunctions in the subsequent process sequences.

According to a further design of the invention (FIG. 13), the electromagnetic waves 35a and 36a which are emitted by the pulse pattern transmitter and modulated and pulsed with the pulse pattern 3, and the electromagnetic fields 37a, 37b trigger stimulus signals at the stimulus receiver 71 of the sensilla 69 located on the antenna 68 which stimulus signals initiate a flight response in the mosquito. The same action arises from the pulse patterns which derive from the surroundings, for example from an atmospheric discharge, which have similar pulse patterns.

Figure 13:
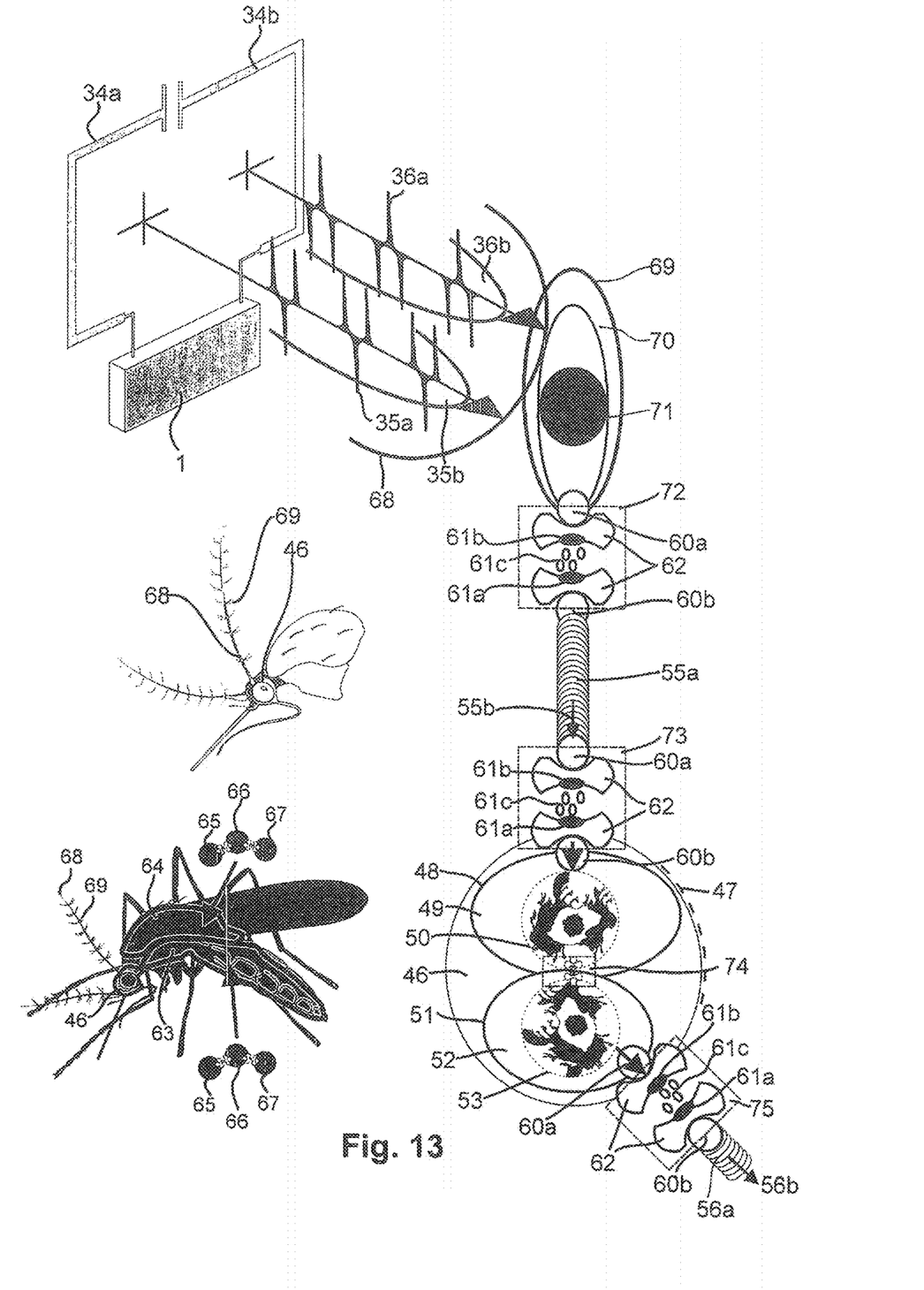

By means of the effect of the electromagnetic fields, the stimulus receiver 71, located in the sensory cell 70, is brought into resonance such that a stimulus signal is generated which in the case of the sensory cell 70 triggers an action which establishes the electrical pulses on the cell surface of the sensory cell 70 (electrical potential) which derive from the electrical depolarisation from the negative to the positive state of charge on the inside of the cell membrane. From this action, the generated electrical signals reach the biological interface 72. The electromagnetic signal transfer takes place via the sensory nerve 55 to the axon 60a of the biological interface 73 via the axon 60b to the dendrite 57a of the sensory neuron 50, which is located in the supraesophageal ganglion 48 (brain of the insect). The forwarding of the signals to the cell nucleus 59 takes place by the dendrite 57 and the cell body 58 being put into a state of energisation which stimulates the cell nucleus 59 such that electrical potentials are established on the cell surface in the form of electrical pulses, which derive from the electrical depolarisation from the negative to the positive state of charge on the inside of the cell membrane such that the neurite 57 establishes an action potential via the cell body 58 by means of the electrical pulses, said action potential initiating a forwarding of the electrical signal to the docked axon 60a of the biological interface 74, which crosslinks the supraesophageal ganglion 48 with the suboesophageal ganglion 51. The initiation of the motor processes, which activates the movement sequences for a flight response in the mosquito, takes place in that the electrical pulses are forwarded via the axon 60b of the biological interface 74 to the dendrite 57a of the motor neuron 50, located in the suboesophageal ganglion 51. The forwarding of the signals to the cell nucleus 59 takes place in that the dendrite 57a and the cell body 58 are put into a state of energisation which stimulates the nucleus 59 such that electrical potentials are established on the cell surface in the form of electrical reflexes, which derive from the electrical depolarisation from the negative to the positive state of charge on the inside of the cell membrane such that the neurite 57a establishes an action potential via the cell body 58 by means of the generated electrical reflexes and reflex information, such that a forwarding of the reflexes to the docked axon 60a of the biological interface 75 is carried out. Via the axon 60b of the biological interface 75, the reflex transfer takes place over the motor nerve cord 56 to the central nervous system 63. Via associated biological interfaces, the reflex information is directed to the motor neurons, which control the motor functions (muscles and glands) of the insects' wings, in order to introduce a flight response such that the insect removes itself from the radiation range of the electromagnetic waves 35a and 36a and electromagnetic fields 37a, 37b which are emitted by the two-channel pulse pattern transmitter 1.

The mosquito is unable to distinguish whether it is facing a natural or artificially generated danger, and will take flight in any case. Said mosquito thus cannot develop a resistance (or conditional resistance) to the method and device according to the invention to generate electromagnetic waves 35a, 36a and fields 35b, 36b which have similar parameters and structures, like those which come from a natural source.

It should be pointed out that of course each of the design variants described above, also the sensory neurons 65, motor neurons 66 and interneurons 67 which are located in the nervous system of insects, are influenced and disrupted through the inward radiating of the electromagnetic waves 35a, 36a and fields 35b, 36b generated by the two-channel pulse pattern transmitter 1 such that an inactive malfunction is triggered.

Insects cannot store inherent behaviour since they lack a complex neural node in the supraesophageal ganglion and a third nerve cord to the suboesophageal ganglion. The muscles, glands and organ movements are controlled by electrical reflexes (reflex signals, reflex information) such that approaches to behaviour and conditional learning processes are made possible by a concentrated sequence of the reflexes. These reflex signals and reflex information are influenced and disrupted by the inward radiating of the electromagnetic waves 35a, 36a and fields 35b, 36b generated by the two-channel pulse pattern transmitter 1 such that a malfunction is triggered which puts the insects into an inactive state.

There are several hundred thousand nerve cells in bloodsucking insects, and these will consequently be illustrated in FIGS. 8, 9, 10, 11, 12, 13 as individual nerve cells 50, 53, 65, 66, 67.

The invention claimed is:

1. A device for repelling bloodsucking insects with a two-channel pulse pattern transmitter which comprises a microprocessor and two transmitters and, via integrated antennas, renders electromagnetic waves emittable, wherein the electromagnetic fields generated influence neurons in the supraesophageal and suboesophageal ganglions, and neurons in the central and peripheral nervous system of bloodsucking insects in order to put them into an inactive state in which they do not penetrate the human skin and thus do not suck the blood, wherein the two-channel pulse pattern transmitter also comprises a modulator and a pulse pattern converter, wherein a pulse pattern generated by the microprocessor can be provided for inputs of the pulse pattern converter by the modulator at a first output as a positively modulated and at a second output as a negatively modulated pulse pattern, and the pulse pattern converter makes it possible to deliver the positively modulated and the negatively modulated pulse patterns to the transmitters in a phase-shifted manner.

2. The device according to claim 1, wherein the two-channel pulse pattern transmitter takes the form of a compact, autonomous module.

3. The device according to claim 1, wherein a coil is connected to a driver which coil can be controlled synchronously with the pulse pattern such that a voltage peak is generated which can be delivered to an FET via the input of the pulse pattern converter, such that the two pulse patterns can additionally be overlaid with a spike pulse.

4. The device according to claim 1, wherein the modulator is expanded with two NAND gates in order to overlay the pulse patterns which are applied to the outputs with a high frequency signal, in order to generate at the outputs of the pulse pattern converter two carrier signals which are forwarded to the antenna terminals.

5. The device according to claim 1, wherein the two-channel pulse pattern transmitter is integrated in a mobile system, a wristwatch, a wristband or a pendant.

6. The device according to claims 1, wherein the two-channel pulse pattern transmitter is integrated in a mains-operated or a battery-operated system or into a system which has a power supply which is supplied by solar cells or fuel cells.

7. The device according to claim 1, wherein the two-channel pulse pattern transmitter is integrated in an adhesive plaster as a compact, autonomous module.

8. The device according to claim 1, wherein the two-channel pulse pattern transmitter includes two additional power amplifiers, which can be connected in series to the transmitters, in order to expand the radiation range.

9. A method for repelling bloodsucking insects with a two-channel pulse pattern transmitter which comprises a microprocessor and two transmitters and which, via integrated antennas, emits electromagnetic waves, wherein the generated electromagnetic fields influence neurons in the supraesophageal and suboesophageal ganglions and neurons in the central and peripheral nervous system of bloodsucking insects, in order to put them into an inactive state in which they do not penetrate the human skin and thus do not suck the blood, wherein the two-channel pulse pattern transmitter also comprises a modulator and a pulse pattern converter, a pulse pattern generated by the microprocessor is provided for inputs of the pulse pattern converter by the modulator at a first output as a positively modulated and at a second output as a negatively modulated pulse pattern, and the pulse pattern converter delivers the positively modulated and the negatively modulated pulse patterns to the transmitters in a phase-shifted manner.

* * * * *